United States Patent
Cummings et al.

(10) Patent No.: US 6,580,319 B1
(45) Date of Patent: Jun. 17, 2003

(54) AMPLITUDE AND PHASE TRANSFER LINEARIZATION METHOD AND APPARATUS FOR A WIDEBAND AMPLIFIER

(75) Inventors: Derald O. Cummings, State College, PA (US); John C. Pavlic, Port Matilda, PA (US); Robert C. Ritter, Bellefonte, PA (US)

(73) Assignee: C-COR.net Corp., State College, PA (US)

( * ) Notice: Subject to any disclaimer, the term of this patent is extended or adjusted under 35 U.S.C. 154(b) by 0 days.

(21) Appl. No.: 09/838,687

(22) Filed: Apr. 19, 2001

Related U.S. Application Data
(60) Provisional application No. 60/198,292, filed on Apr. 19, 2000.

(51) Int. Cl.⁷ ............................. H03F 1/26; H03F 1/30; H03F 3/04
(52) U.S. Cl. .................. 330/149; 330/144; 330/289
(58) Field of Search ................. 330/144, 149, 330/289

(56) References Cited

U.S. PATENT DOCUMENTS

| | | | |
|---|---|---|---|
| 5,361,156 A | * 11/1994 | Pidgeon | 359/161 |
| 5,523,716 A | 6/1996 | Grebliunas et al. | 330/149 |
| 5,600,472 A | 2/1997 | Uesaka | 359/161 |
| 5,606,286 A | * 2/1997 | Bains | 330/149 |
| 5,703,530 A | 12/1997 | Sato et al. | 330/149 |
| 5,789,978 A | * 8/1998 | Zhang et al. | 330/149 |
| 5,939,920 A | 8/1999 | Hiraizumi | 327/306 |
| 6,107,877 A | * 8/2000 | Miguelez et al. | 330/149 |

* cited by examiner

Primary Examiner—Patricia T. Nguyen
(74) Attorney, Agent, or Firm—Price & Adams

(57) ABSTRACT

In a transfer linearization (TL) circuit one or more biased nonlinear elements form a nonlinear attenuator and a biased network to allow adjustment of diodes to linearize the overall transfer of the TL circuit and an amplifier being linearized. The transfer linearization circuit reduces distortion encountered in a broadband RF amplifier. The circuit compensates for attenuation of amplified broadband signals in CATV systems. The transfer linearization circuit provides low insertion loss and requires very low power consumption. Nearly constant impedance and constant insertion loss is provided across a wide frequency range and reduces both in-band and out-of-band third order distortions. The TL circuit exhibits instantaneous amplitude and phase transfer correction. No tuned frequency selective components are required so that adjustments are relatively straightforward.

6 Claims, 9 Drawing Sheets

AMPLITUDE AND PHASE TRANSFER LINEARIZATION METHOD AND APPARATUS FOR A WIDEBAND AMPLIFIER

CROSS REFERENCE TO RELATED APPLICATION

This application claims the benefit of U.S. Provisional Application Serial No. 60/198,292 filed Apr. 19, 2000.

BACKGROUND OF THE INVENTION

1. Field of the Invention

This invention relates to method and apparatus for linearizing the transfer characteristics of a wideband, temperature stable amplifier and, more particularly, to reducing the distortion encountered in a broadband silicon based bipolar junction transistor (BJT) amplifiers, CATV repeaters, and electro-optic driver amplifiers.

2. Description of the Prior Art

Predistortion and linearization methods and apparatus are well known in the art of CATV systems to compensate for distortion of amplified broadband signals. Most of the known methods are complex and have high insertion loss in order to provide substantial magnitude of distortion cancellation (>10 dB, typically). Some methods utilize a closed loop approach; while, other methods are open loop systems. Many of the prior art linearization methods encounter high insertion loss (several dB) and require additional amplification stages for implementation.

Most of the prior art methods also have a limited range of output level where best results occur and they are restricted to near room temperature operation. Furthermore, their adjustment must be tailored to a specific channel plan frequency assignment set. For CATV outdoor application, the linearization method must be operable over a wide temperature range. For logistical reasons, it must be capable of good performance over a wide range of operating levels and channel plans. Therefore, there is need for a linearization method directed to low insertion loss, for example, 2 dB or less, and characterized by very low power consumption.

Many of the prior art methods utilize diode-based circuits to reduce composite triple beat (CTB) and cross modulation (XM) distortion. Most methods use complex circuitry and normally experience high insertion loss (up to 10 dB). To accommodate such a large insertion loss, systems that use these methods require additional amplification stages to compensate for the loss. As a result, most linearization methods have been limited to complex, high cost circuitry usable only in headend equipment, such as 1310 nm and 1550 nm fiber optic forward path transmitters.

U.S. Pat. No. 5,703,530 discloses a radio-frequency amplifier circuit that utilizes a distortion generation circuit ("DGC"). The DGC is employed in the radio-frequency amplifier to reduce composite triple beat distortion and cross modulation distortion and to linearize the gain across the desired bandwidth. The radio-frequency amplifier is disclosed with the DGC inserted at selected points in the amplification stage. For example, the DGC is positioned in a number of embodiments at the input, output, both the input and output and intermittently between the input and the output. The '530 patent approach was mainly intended for inclusion within an RF hybrid, as opposed to external to the RF hybrid, as the present invention. Furthermore, the '530 patent does not address the need for temperature compensation, nor the wide range of operating levels and channel plans needed for CATV repeater use.

U.S. Pat. No. 5,600,472 discloses a distortion generating circuit that includes a low-distortion amplifier for giving a nonlinear distortion component to an input signal and an amplifier for receiving a signal output from the distortion generating circuit and amplifying it. The distortion generating circuit is not suitable for general purpose outdoor use with equipment providing multiple channel, fixed gain repeaters for analog transmission, such as CATV RF amplifiers.

U.S. Pat. No. 5,939,920 discloses an apparatus and method for providing distortion to an input signal.

Other relevant prior art includes U.S. Pat. No. 5,523,716 which discloses a microwave predistortion linearizer. This is not relevant to CATV repeater amplifier application. As with most of the above-discussed prior art patents, the prior art devices do not address the need for temperature compensation in predistortion applications.

Therefore, there is a need in predistortion applications for simple, low cost, and low loss technique, together with temperature compensation to control the nonlinear element bias current to compensate for known variations in forward diode voltage and amplifier distortion level changes with temperature. This would allow a transfer linearization technique to be used in outdoor applications subject to a wide temperature variation and a variety of operating levels and channel loading at a low cost, with high reliability, and good distortion reduction.

SUMMARY OF THE INVENTION

In accordance with the present invention there is provided a method for reducing second and third order distortion in RF amplifiers and broadband transmission systems caused by amplifier compression in silicon-based bipolar RF amplifiers. The technique also extends to driving electro-optic devices, such as laser transmitters, which exhibit compressive transfer characteristics at high signal levels. A first ac current component is separated from the input signal to provide a first signal representing the first alternating current component and a second signal representing the input signal having the first ac component is separated therefrom. Nonlinear attenuation to the second signal is provided to produce a modified second signal. The modified second signal is combined with the delayed and level adjusted first signal to produce a corresponding output signal.

Further in accordance with the present invention, there is provided a method for supplying a modified RF signal to an amplifier. A first portion of an unmodified RF signal is passed through a linear attenuator. Then the first portion of the unmodified RF signal is passed through a time delay component to form a first portion of a modified RF signal. A second portion of an unmodified RF signal is passed through a dc blocking device to a nonlinear attenuator using one or more biased diodes. The second portion of the unmodified RF signal is modified by the nonlinear attenuator to form a second portion of a modified RF signal. The first portion of a modified RF signal is combined with the second portion of a modified RF signal to form a modified RF signal for supplying to an amplifier. The modification incorporated in the signals complements the amplitude and time delay transfer characteristic of the amplifier, thereby reducing distortion.

Accordingly, a principal object of the present invention is to incorporate the transfer linearization circuit in a bridged tee network. The bridged tee network is characterized by constant impedance, allowing amplitude equalization versus frequency.

The present invention provides for a wideband, low insertion loss, low cost, high reliability third order distortion reduction of 4 to 10 dB over a wide temperature range using simple temperature compensation of the nonlinear circuit element(s).

Another object of the present invention is to provide a transfer linearization circuit for reducing distortion in CATV systems in which independently biased diodes provide simultaneous reduction of both second and third order distortions.

A further object of the present invention is to provide in a transfer linearization circuit with low insertion loss, and at high frequencies to provide loss compensation, so the overall frequency response is flat while maintaining a constant impedance.

An additional object of the present invention is to provide in CATV systems utilizing RF amplifiers wideband distortion reduction both in-band and out-of-band, further, to provide good distortion reduction for a variety of operating levels and channel plans over a wide temperature range.

These and other objects of the present invention will be more completely described and disclosed in the following specification, accompanying drawings, and appended claims.

DESCRIPTION OF THE PREFERRED EMBODIMENTS

Figure 2:
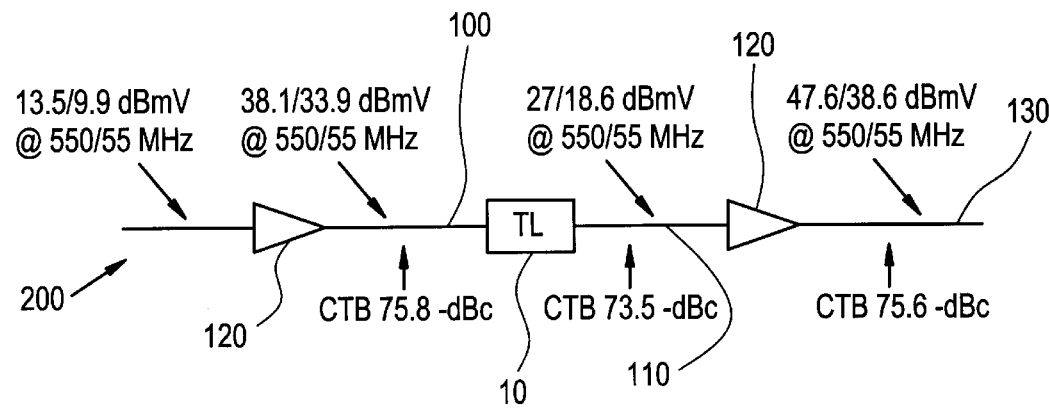
FIG. 2 is a block diagram similar to FIG. 1 of a CATV line extender repeater amplifier, illustrating a transfer linearization circuit.

Transfer linearization is a form of radio frequency (RF) predistortion. Typically, predistortion methods provide insertion loss in the range of 5 to 10 dB. This high an insertion loss requires additional gain and power consumption when used in a CATV repeater amplifier. Transfer linearization provides very low insertion loss (<2 dB). Referring to FIG. 2, the transfer linearization circuit 10 allows 2 dB to 3 dB higher output levels for the same distortion at the repeater amplifier output than would be encountered without benefit of the present invention. A small amount of bias power, typically under 50 mW, is used for the present method.

The distortion reduction provided by the transfer linearization circuit 10 of FIG. 2 is broadband. Both in-band and out-of-band distortion products are reduced. The transfer linearization circuit of FIG. 2, item 10 is particularly adapted to broadband CATV silicon based bipolar junction transistor amplifiers, but is not limited to any particular amplifier. It also has application for multiple amplifiers cascaded, and overall linearization improvement of electrical-to-optical conversion, as well.

The ranges of frequency for the typical broadband CATV silicon based bipolar junction transistor amplifier that can receive benefit from the transfer linearization circuit includes 5–200 MHz and 50–870 MHz, and more generally, 1 MHz to 1000 MHz. Typically an RF amplifier consumes 5 to 10 W. Transfer linearization typically consumes less than 50 mW, less than 1% of a single RF hybrid power. Transfer linearization can be used in many different circuits including, but not limited to, circuits for RF hybrid amplifiers, CATV repeater stations containing two or more RF hybrids, such as trunks, bridgers and line extenders, as well as fiber optic nodes for both forward and reverse path application.

Figure 1:
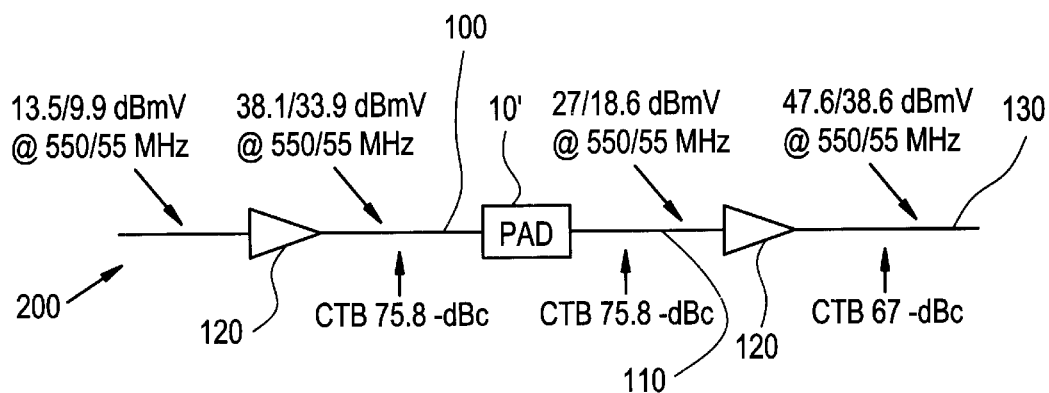
FIG. 1 is a block diagram of a prior art CATV line extender repeater amplifier, illustrating a transfer linear attenuator in place of a transfer linearization (TL) circuit.

Referring to FIGS. 1 and 2, there is illustrated a two RF hybrid amplifier 200 generally designated by the numeral having a plurality of RF amplifiers 120. As shown in FIG. 1, the two RF hybrid amplifier 200 may include a linear attenuator 10' that does not include a transfer linearization circuit as shown in FIG. 2. FIGS. 1 and 2 illustrates the challenge of transfer linearization as applied to a two-stage amplifier. Without transfer linearization the distortion is set primarily by the output RF hybrid amplifier 200. Approximately 2 dB of the total distortion at the output of transmission line 130 is attributed to the input RF hybrid amplifier 120.

With transfer linearization the output distortion is lowered so it is comparable to that of the input RF hybrid. This means that the input amplifier is a significant contributor to overall distortion. To be useful in a CATV system exposed to −40° C. to +60° C. ambient temperature, the distortion improvement shown in FIG. 2 must be maintained over temperature, because the temperature compensation of TL is a necessity for outdoor equipment application.

Referring now to FIG. 2, there is illustrated a transfer linearization circuit generally designated by the numeral 10 that is positioned between a first transmission line 100 and a second transmission line 110. The transfer linearization circuit 10 receives an input signal from the first transmission line 100. The transfer linearization circuit changes the waveform of the input signal to provide an output signal to the second transmission line 110. The output signal is provided to an amplifier 120 and is linearized. The linearized output signal is supplied to a third transmission line 130.

Figure 3:
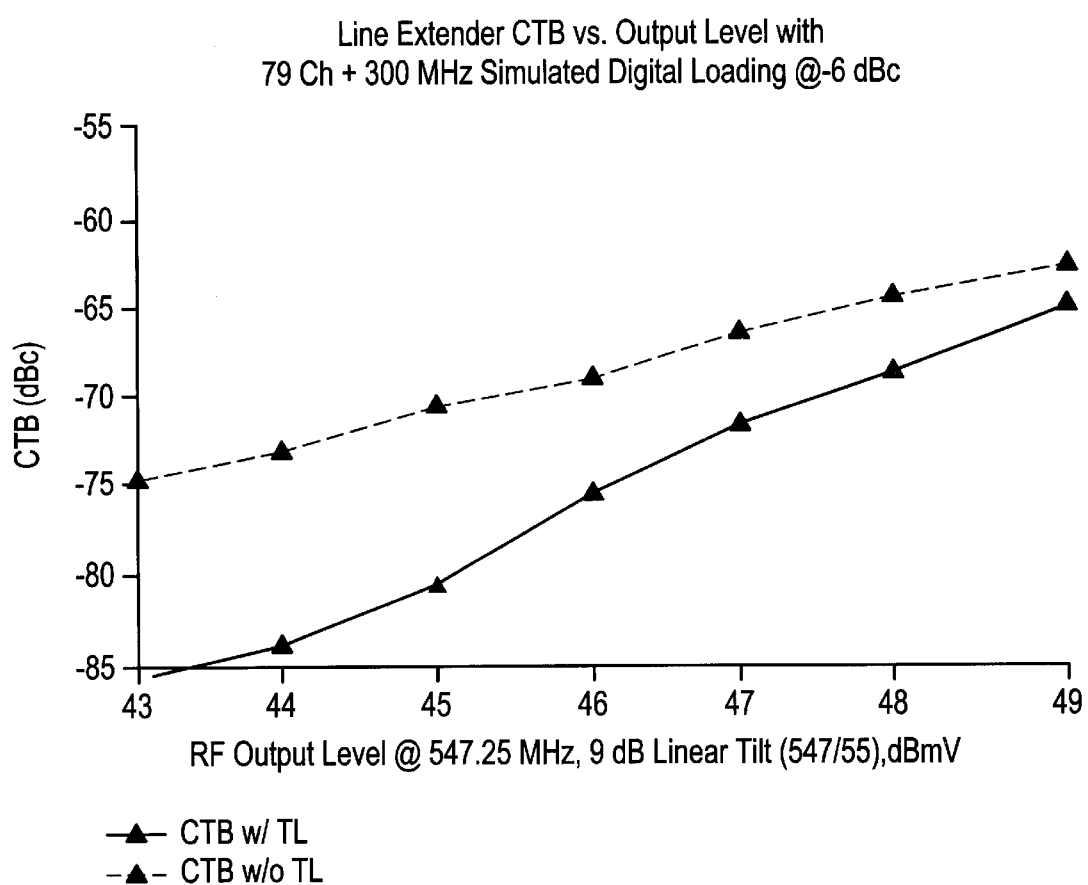
FIG. 3 is a graphic illustration of composite triple beat distortion vs. RF output for the same line extender with and without transfer linearization.

Referring now to FIG. 3, there is illustrated a plot of composite triple beat distortion vs. RF output level for the two different line extenders, one without TL and the other with TL. FIG. 3 illustrates the improvement provided with transfer linearization in a two RF hybrid CATV amplifier 200 having 79 channels (9 dB linear output tilt) plus 300 MHz of simulated digital loading at −6 dBc to 870 MHz. Normal operating levels without transfer linearization are +44/35 dBmv at 547/55 MHz. With transfer linearization the levels can be increased 2 dB for the same output distortion level. Similar improvements are seen when comparing other multiple RF hybrid CATV repeater amplifiers with 96 and 112 channel loading.

Figure 4:
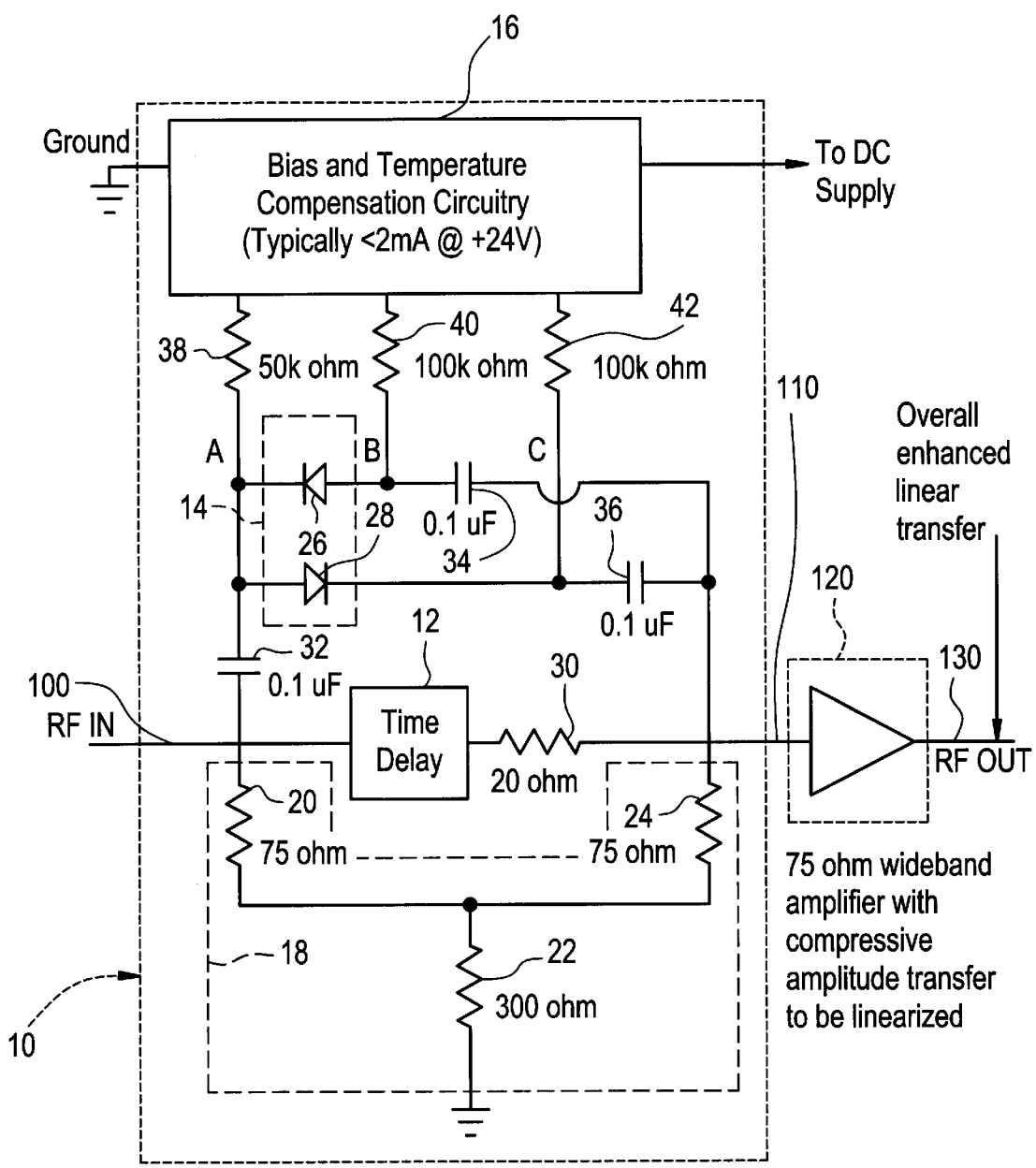
FIG. 4 is a circuit diagram of a transfer linearization circuit illustrating a bridged tee attenuator.

Referring to FIG. 4, there is illustrated a transfer linearization circuit generally designated by the numeral 10 that is positioned between a first transmission line 100 and a second transmission line 110. The transfer linearization circuit 10 receives an input signal from the first transmission line 100. The transfer linearization circuit changes the waveform of the input signal to supply an output signal to the second transmission line 110. The output signal is supplied to an amplifier 120 and is linearized. The linearized output signal is provided to a third transmission line 130.

With the embodiment of the transfer linearization circuit 10, shown in FIG. 4, the input signal is a RF signal. The RF signal is transmitted through transmission line 100. The transmission line 110 is coupled to a time delay component 12 and resistive component 18 for modifying a first portion of the input signal and nonlinear attenuator 14 modifies a second portion of the input signal. The time delay component 12, resistive component 18, and the nonlinear attenuator 14 are in parallel. The time delay component 12 and resistive component 18 are coupled to the transmission line 110 for transmitting an output signal. The nonlinear attenuator 14 is also coupled to the transmission line 110.

The transfer linearization circuit 10 separates the signal from the input transmission line 100 into two portions, a first portion and a second portion. The time delay component 12 and resistive component 18 receive the first portion. The nonlinear attenuator 14 receives the second portion.

The time delay component 12 adjusts the first portion of the input signal by introducing a time delay into the signal. The time delay is fixed. The time delay component 12 and resistive components 18 convert the first portion of the input signal into a modified first portion of the input signal. The resistive component 18 modifies the first portion of the input signal by introducing linear loss. The modified first portion of the input signal is transferred to the transmission line 110 for output. The resistive component 18 provides the basic series branch loss element of the bridged tee attenuator circuit, which can also provide amplitude equalization over a wide bandwidth and still maintain constant input and output impedance.

The input transmission line 100 supplies the second portion of the input signal to the nonlinear attenuator 14. The nonlinear attenuator 14 modifies the waveform of the second signal to provide a modified second portion of the input signal.

The nonlinear attenuator 14 includes a level variable, nonlinear attenuator. The nonlinear attenuator 14 converts the second portion of the input signal into a component of the output signal, which is suitable for amplification by amplifier 120.

The nonlinear attenuator 14 performs amplitude expansion is performed on positive going and negative going amplitudes. The nonlinear attenuator 14 can be adjusted to enhance the linearity of amplitude transfer for positive or negative going signals independently. The nonlinear attenuator 14 produces second order or third order distortions, or both second and third order distortion components. The amplitude and time delay modifications by the nonlinear attenuator 14 of the second portion of the input signal are adjusted to enhance the linear transfer characteristics of the amplifier 1200 or system being linearized.

TL can be optimized for third order distortion reduction or second order distortion reduction. Under certain circumstances both second and third order distortions can be reduced. Because the nonlinear attenuator 14 characteristics vary with temperature, the TL circuit includes temperature compensation. Furthermore, the characteristics of the device (s) being linearized vary with temperature so the temperature characteristics of both must be included for implementation in a broadband CATV repeater amplifier used in outdoor application. The benefit of TL is that not only can it improve the distortion performance of one RF hybrid, but it can do so for a pair (preamp and output amplifier) with TL used interstage.

Still further, when multiple transfer linearized amplifiers are cascaded the resulting distortions add less severely than for non-transfer linearized amplifiers. And finally, the technique is applicable to electro-optic conversion devices such as AM fiber optic laser transmitters. By considering the overall electrical and optical transfer characteristics the system of driver amplifier and laser output can be significantly enhanced.

The output signal from the transfer linearization circuit 10 includes the adjusted first portion of the input signal with the adjusted second portion of the input signal. The transfer linearization circuit 10 combines the adjusted first portion of the input signal with the adjusted second portion of the output signal to form the output signal. The transfer linearization circuit 10 provides higher output levels with lower distortion levels at transmission line 130 than can be achieved without TL. The output signal at transmission line 130 in FIG. 2 provides a higher output level at a lower distortion level than is possible without TL shown in FIG. 1.

As is shown in FIG. 4, the transfer linearization circuit 10 includes a compensation circuit 16. The compensation circuit 16 adjusts the attenuation level of the nonlinear attenuator 14. The compensation circuit 16 compensates to account for temperature changes, which change the waveform of the input signal. The compensation circuitry 16 also adjusts the nonlinear attenuator 14 to compensate for external conditions, specifically temperature variation.

Temperature variation has a moderate effect on performance to the extent that about 2 to 4 dB distortion change can occur in an amplifier for a temperature range of −40 to +85° C. For outdoor CATV repeater amplifiers the distortion change with temperature can be more than twice this amount. Bias current temperature compensation is used to keep performance nearly constant. With the transfer linearization circuit of the present invention, over the −40 to +85° C. temperature range, less than 2 dB change in distortion performance at constant output level is observed.

The transfer linearization circuit shown in FIG. 4 also includes a bridged-tee attenuator 18 which provides increased low frequency loss and decreased high frequency loss. The bridged-tee attenuator 18 includes resistors 20, 22, and 24 in a bridged-tee configuration. The resistors 20, 22, and 24 are linear resistive elements. The linear resistive elements provide a fixed impedance of the first path through the transfer linearization circuit 10.

As is shown in FIG. 4, the transfer linearization circuit 10 comprises a dc block 32. The dc block 32 keeps the dc current contained within the nonlinear attenuator 14. In the preferred embodiment, the dc block 32 comprises a capacitor. The capacitance of the dc block is quite large, 0.1 uF. Accordingly, since the dc block 32 allows high frequency ac current to pass through the first path. A dc block 36 provides a low impedance path for high frequency AC signals.

The nonlinear attenuator 14 shown in FIG. 4 includes one or more biased nonlinear elements. The compensation circuit 16 adjusts the bias of the nonlinear elements. In a preferred embodiment, the nonlinear attenuator 14 includes a pair of biased diodes 26, 28. When one diode is turned on the other becomes reverse biased. With the opposite polarity the second diode turns on and the first diode turns off, but this varies in degree with the bias setting. Less attenuation is provided at higher amplitude levels due to the shunting effect of the forward biased diode. This results in a slight expansion of the transfer characteristic to compensate for compressive effects at higher levels in the amplifier 1200.

The diodes 26, 28 are positioned back-to-back in parallel with the series branch. Separate bias is provided for each diode 26, 28. The compensation circuit 16 can adjust the bias of the diodes 26, 28, as needed.

The diodes 26, 28 are coupled with a pair of dc blocks 34, 36. The dc blocks 34, 36 provide a path for the output of diodes 26, 28, while keeping the dc current within the nonlinear attenuator circuit of diodes 26, 28. The path has low impedance for the passband of interest. In the embodiment shown in FIG. 4, dc blocks 34, 36 are capacitors. Capacitor 34 is in series with diode 26, which is in parallel with diode 28. Capacitor 36 is in series with the circuit formed by diodes 26, 28 and capacitor 34. The capacitance of capacitors 34, 36 is quite large, for example 0.1 uF.

The compensation circuit 16 can adjust the magnitude of attenuation of second portion of the input signal by adjusting the nonlinear attenuator 14. The compensation circuit 16 can adjust the nonlinear attenuator by changing the bias of the diodes 26, 28. Reverse diode bias is created on either diode with an appropriate bias arrangement. This is useful for second order reduction and allows simultaneous second and third order reduction.

The compensation circuit 16 adjusts the bias of the diodes to linearize the output signal of the transfer linearization circuit 10 and the output of the amplifier 120. The adjustment of diode bias can be made symmetric or not, so as to minimize the second order distortion while also reducing third order distortion, the dominant distortion in push-pull amplifiers at high output level.

Figure 5:
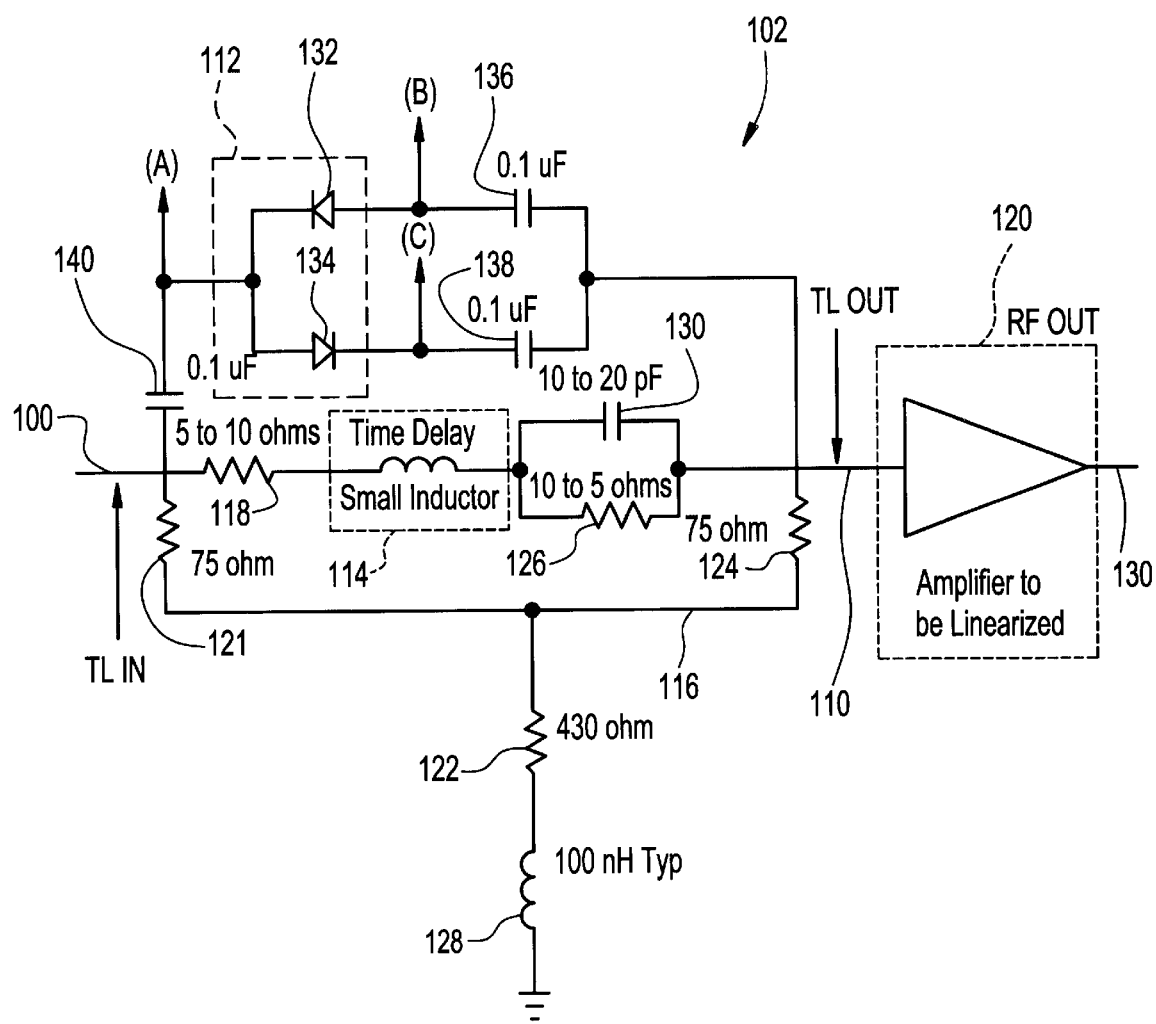
FIG. 5 is a circuit diagram of an ultra low loss transfer linearization circuit.

Referring to FIG. 5, there is illustrated an embodiment of a transfer linearization circuit 102. The transfer linearization circuit 102 provides ultra low insertion loss in the range <1 dB from 50–870 MHz. The transfer linearization circuit 102 includes a first branch of the circuit, which has a time delay component 114, in parallel with a second branch of the circuit, which has a nonlinear attenuator 112. The first branch of the circuit is a shunt path.

The transfer linearization circuit 102 also divides the incoming input signal from the transmission line 100 into a first portion and a second portion. The first portion of the input signal follows the shunt path of the circuit 102. The second portion of the input signal follows the second branch of the circuit.

The shunt path comprises a time delay component 114 and loss equalization circuitry 116. The time delay component 114 comprises a small inductor. The time delay component 114 of circuit 102 provides fixed time delay into the first portion of the input signal. The value of time delay is small and is selected to achieve the best performance with a given circuit layout.

The loss equalization circuitry 116 includes resistors 118, 121, 122, 124, 126, inductor 128, and capacitor 130. The components of the loss equalization circuitry 116 are positioned to provide ultra low transmission loss. The magnitude of the impedance provided by the components is determined by the desired frequency characteristics of the circuit 102 of the input signal.

The loss equalization circuitry 116 of the transfer linearization circuit 102 differs in configuration from the first path of transfer linearization circuit 10. Resistors 121, 122, and 124 form a bridged-tee attenuator, as is shown in FIG. 4. However, the loss equalization circuitry 116 includes additional components.

The time delay component 114 is positioned between the resistor 118 and a circuit formed by resistor 126 and capacitor 130. The magnitude and position of resistor 118, time delay component 114, resistor 126, and capacitor 130 provides a small inductance in the series branch, in association with parasitic capacitance to ground. Time delay component 114 provides a small time delay in the path through resistor 118 and resistor 126. The capacitor 130 is positioned on the shunt path to further reduce loss at high frequencies.

The second path of the transfer linearization circuit 102 also differs in configuration from the second path of the transfer linearization circuit 10. As shown in FIG. 5, the second path of the transfer linearization circuit 102 comprises a nonlinear attenuator 112. The nonlinear attenuator 112 also comprises a pair of biased diodes 132, 134, which adjust the second portion of the input signal. The bias of diodes 132, 134 can be modified by the bias and temperature compensation circuitry shown in FIG. 6.

As shown in FIG. 5, the second path of the circuit 102 includes series coupling capacitors 136, 138, and 140. The capacitance of capacitors 136, 138, and 140, is also quite large, for example 0.1 uF, as compared to the capacitance of capacitor 130. The use of large coupling and bypass capacitors is necessary for synchronous cross modulation to prevent anomalous behavior when the power loading changes, with time.

Capacitor 140 is positioned to split the incoming input signal into a first portion and a second portion. The amplitude of the first portion is expected to be much greater than the amplitude of the second portion. Capacitor 140 also prevents dc current from reaching the bridged tee attenuator 116.

The capacitors 136, 138 provide a path for output signals from diodes 132, 134. The output signals from diodes 132, 134 form the attenuated second portion of the input signal. The capacitors 136, 138 also prevent dc current from passing through the bridged tee attenuator.

Figure 6:
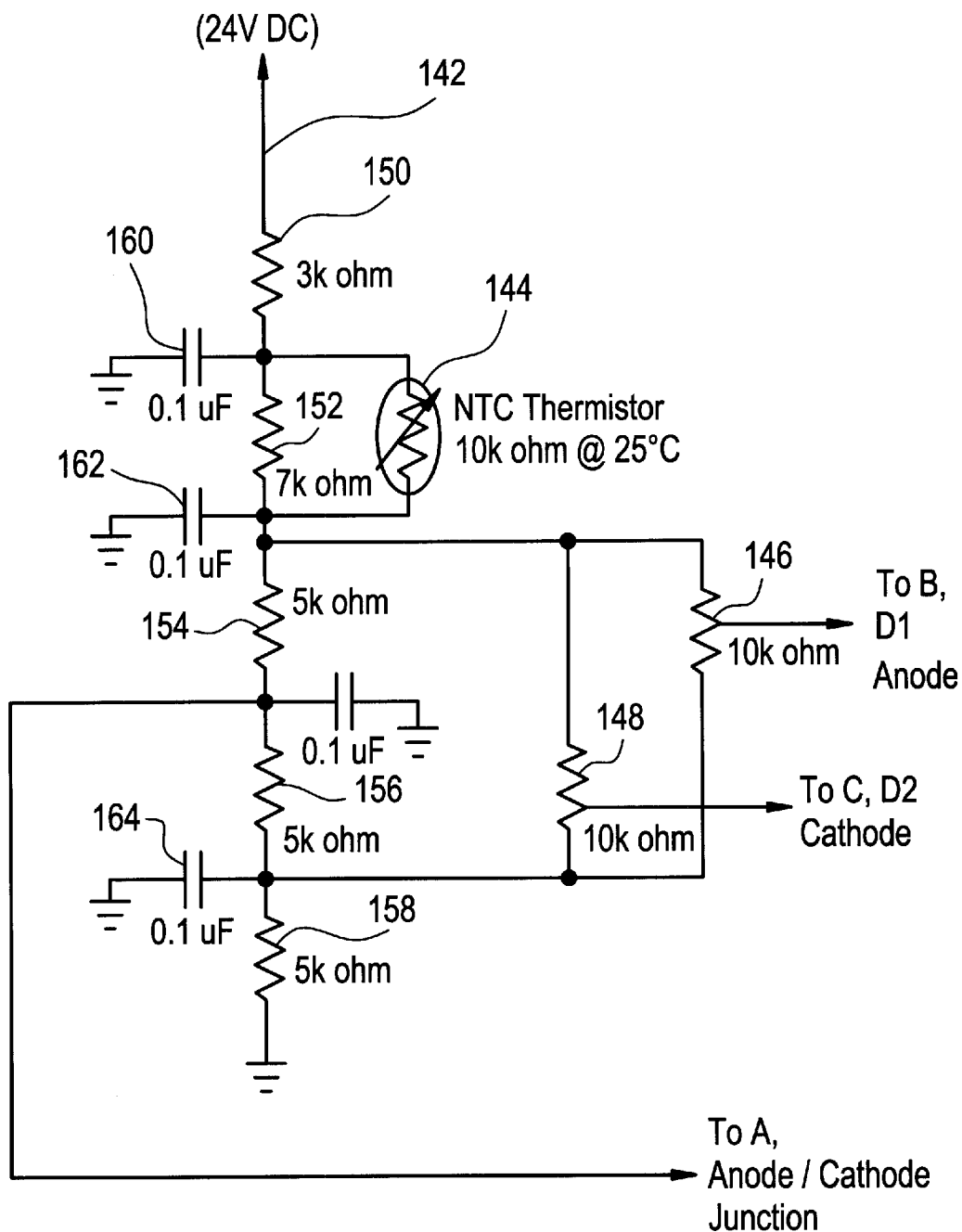
FIG. 6 is a circuit diagram for a bias and temperature compensation circuit for a transfer linearization circuit.

As shown in FIGS. 5 and 6, there is shown a bias and temperature compensation circuit 142 for the transfer linearization circuit 102. The bias and temperature compensation circuit 142 is configured to function with amplifier 120. The compensation circuit 142 allows the linearization circuit 102 to perform over a greater range of temperatures than a linearization circuit that has no compensation circuit. The bias and temperature compensation circuit 142 improves the performance of the linearization circuit with respect to temperature by adjusting the nonlinear attenuator 112.

The compensation circuit 142 controls the nonlinear attenuator 112 by adjusting the bias of the diodes 132, 134. The compensation circuit 142 includes a device 144 for measuring temperature and adjusting the output of the compensation circuit 142 to accommodate changes in temperature. The device 142 can include separate components for measuring temperature and for adjusting the output, such as a thermometer coupled to a microcontroller.

The transfer linearization circuit 102 includes a thermistor to perform both functions. The thermistor 144 responds to temperature changes and increases or decreases the bias current in the voltage divider to increase or decrease the diode current. The thermistor 144 has a negative temperature coefficient of resistance.

The compensation circuit 142 also includes adjustable components 146, 148 for trimming the bias voltage of the diodes 132, 134. The magnitude of the bias has little effect on composite second order distortion, but has a significant effect on composite triple beat distortion and on cross modulation distortion. Accordingly, the adjustable components 146, 148 can be adjusted to account for the effect of changes in the bias. Preferably, the adjustable components 146, 148 are potentiometers. The potentiometer is set to a preselected level to optimize performance of the transfer linearization circuit shown in FIG. 6.

The bias and temperature compensation circuit also includes additional circuit elements, such as resistors 150, 152, 154, 156, 158 and capacitors 160, 162, 164.

Figure 7:
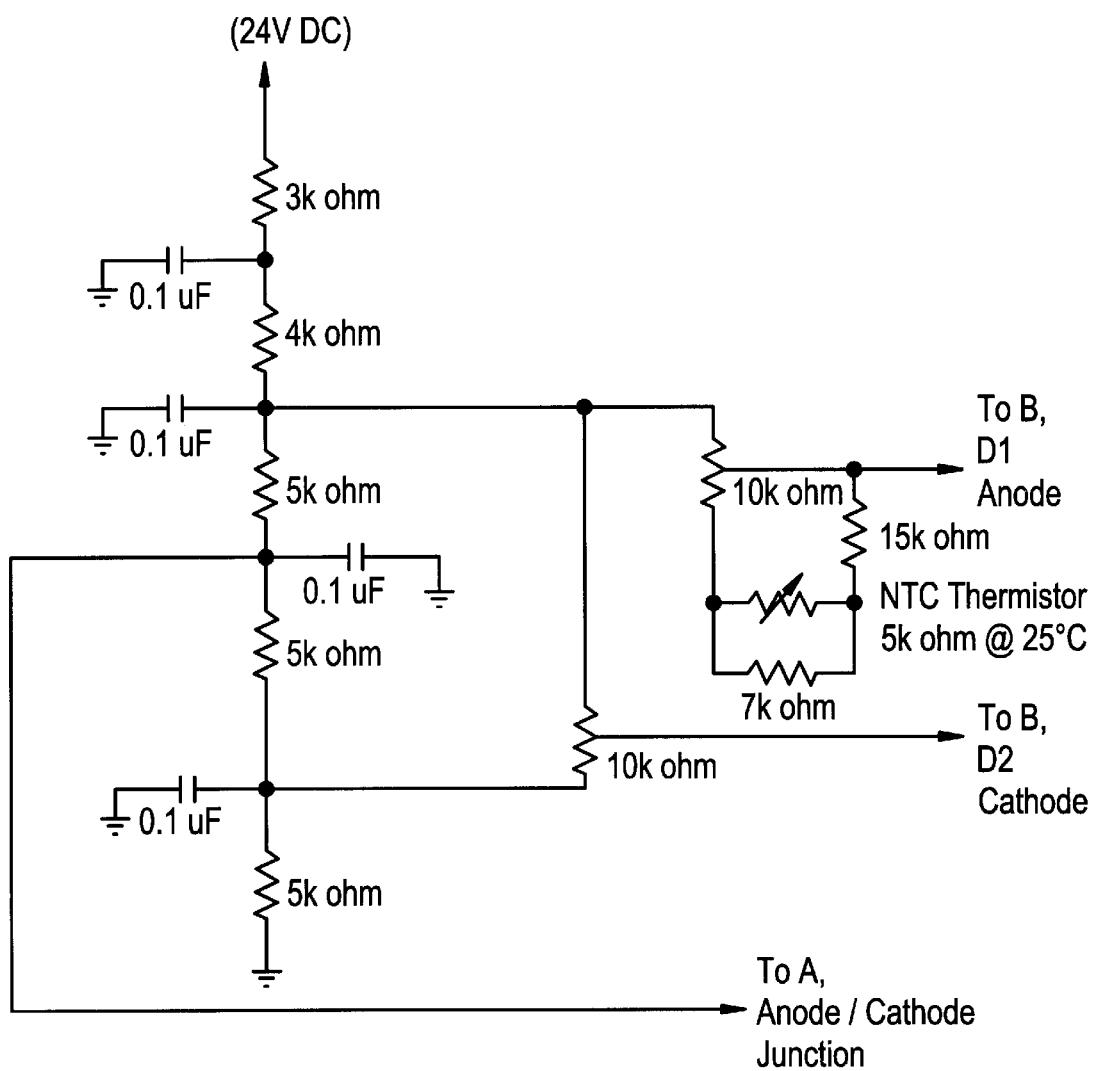
FIG. 7 is a circuit diagram for a bias and temperature compensation circuit for a transfer linearization circuit as applied to a CATV repeater amplifier having the thermistor moved.

An additional embodiment of a bias and temperature control circuit is shown in FIG. 7. The bias and temperature control circuit is constituted to function with the transfer linearization circuit shown in FIG. 4 or FIG. 5.

Figure 8:
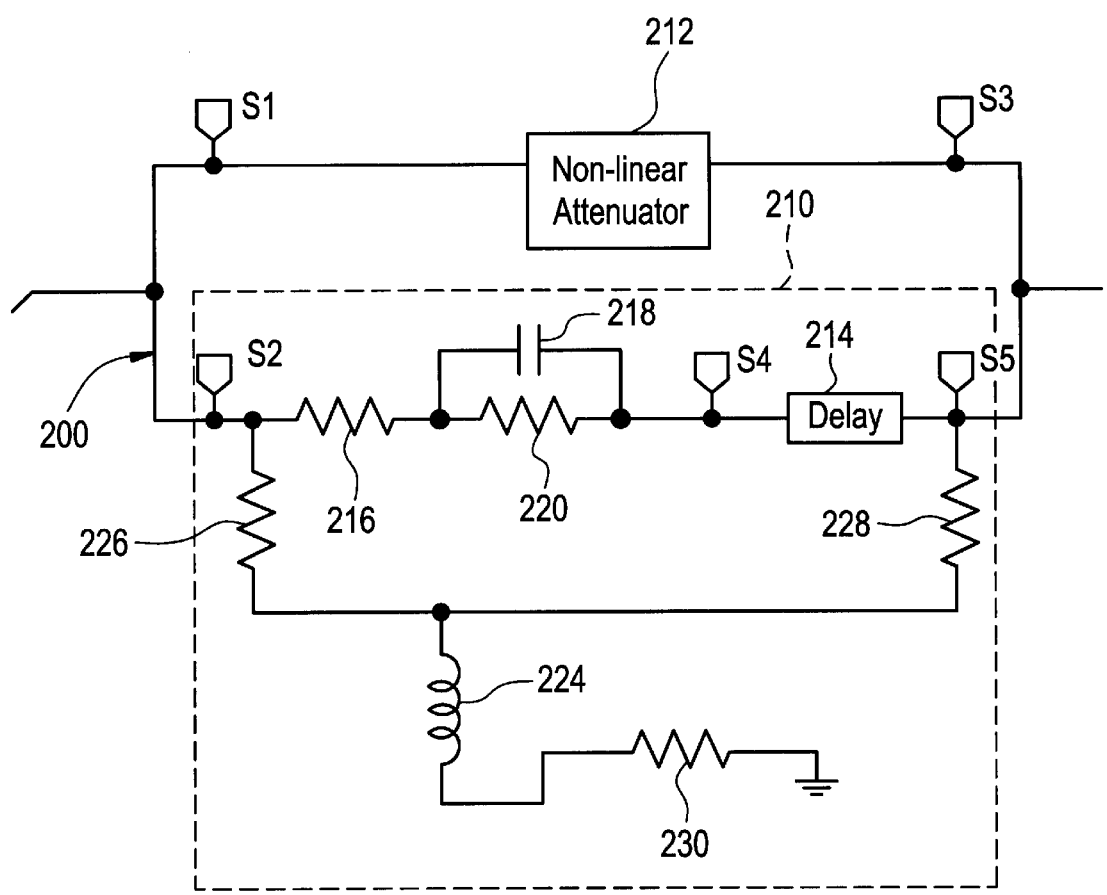
FIG. 8 is a circuit diagram of one embodiment of a transfer linearization method.

A further embodiment of a transfer linearization circuit 200 is illustrated in FIG. 8. The transfer linearization circuit 200 includes a nonlinear attenuator 212 and a linear attenuator 210. The linear attenuator 210 includes a time delay component 214 and linear resistive elements 216, 220, 226, 228, and 230.

FIG. 8 illustrates that the linear resistive elements 216, 220 in the attenuator can have additional configurations. The time delay component 216 can be positioned before, after, or between, in series with the other components of the linear attenuator 210. Accordingly, the configuration of the linear attenuator 210 depends upon the characteristics of the input signal and the desired characteristics of the amplifier output.

Several components in the transfer linearization circuit of the present invention are critical to obtaining the desired operation for the nonlinear attenuator. First, the diodes used are low capacitance silicon Schottky barrier diodes having low forward voltage. Other types of diodes can be used, such as silicon P-N junction diodes, GaAs Schottky barrier types, or the gate-to-channel junction of metal-semiconductor field effect transistors (MESFETs) to provide the level variable loss and phase transfer characteristics of the nonlinear attenuator.

The gain of the amplifier being linearized dictates what forward voltage is needed to properly linearize the signal level at the input to the amplifier. A lower gain amplifier, for example 12 dB, needs a higher forward voltage diode. A higher gain amplifier, for example 20 dB, needs a lower forward voltage diode. For 20 dB amplifier gain, a silicon Schottky barrier diode works well. Two or more diodes can be connected in series to achieve the same effect as using a higher forward voltage diode. The bias on the diodes is critical, as typically currents are in range of a few microamperes (uA) to several tens of microamperes.

Figure 9:
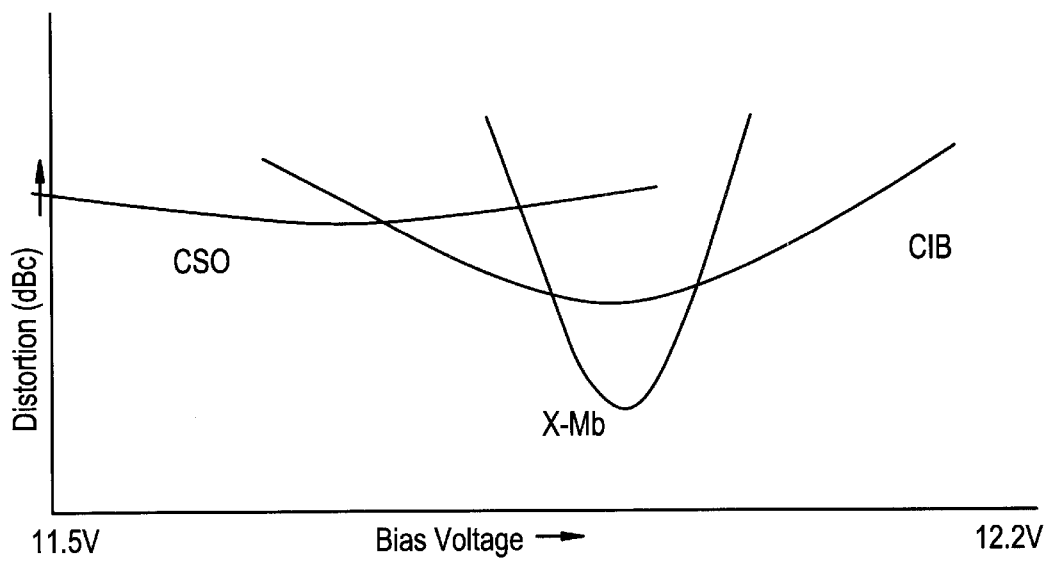
FIG. 9 is a graphic illustration of distortion vs. bias for a transfer linearization circuit.

Referring now to FIG. 9, there is graphically illustrated a typical second order and third order distortion versus applied bias to a transfer linearization circuit. The second and third order nulls generally occur at different bias points. Cross modulation is generally more sensitive to null adjustment than is composite triple beat, so it is the more critical parameter to set. FIG. 9 illustrates that the optimum performance of the circuit is over a narrow voltage range. The narrow voltage range indicates the need for a temperature compensation circuit.

Another critical aspect of the transfer linearization circuit is component leadlength, especially for the series branch linear resistive attenuator. A time delay element is achieved for many applications by series resistor leadlength or by microstrip transmission lines on the printed circuit board. But this feature contributes to high frequency insertion loss. In the shunt branch of the bridged tee attenuator, additional leadlength is beneficial for reducing high frequency loss. Inductance in the shunt branch provides some equalization for high frequencies.

Figure 10:
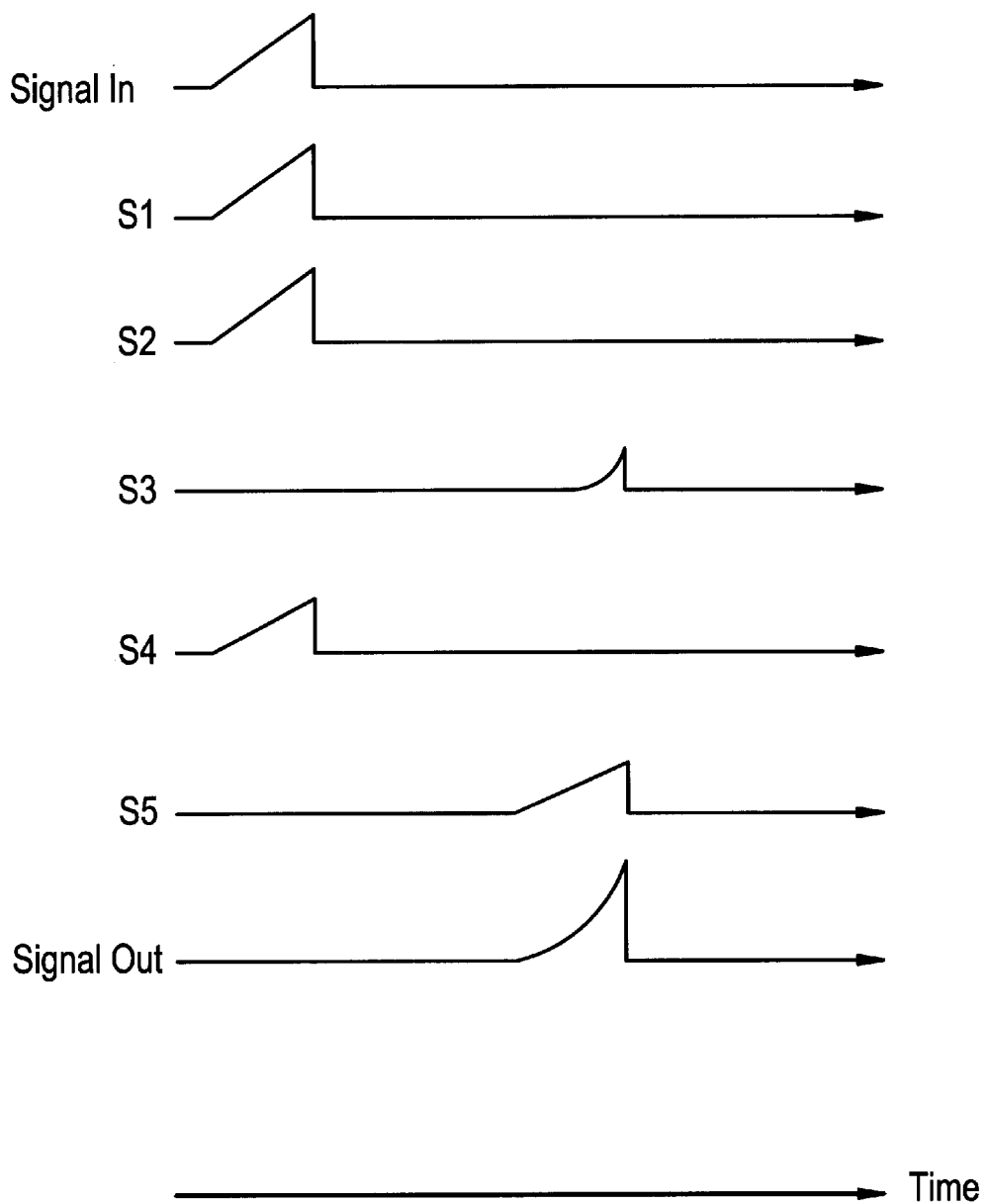
FIG. 10 is a graphic illustration of waveform vs. time at points within a transfer linearization circuit.

Referring now to FIG. 10 and FIG. 5, the waveform of the signal at various points in the transfer linearization circuit is shown. In operation, the transfer linearization circuit 102 separates an incoming RF signal into two portions and recombines the two portions before transferring the signal to a transmission line 110. The transmission line 110 transmits the RF signal to an amplifier 120 for amplification. The amplified signal is transmitted to a second transmission line 130.

The transfer linearization circuit 102 fundamentally distorts the waveform of the RF signal. The RF signal separates into two portions, which pass through two different paths in the transfer linearization circuit 102. The first portion follows the first path of the circuit 102. The blocking device 140 allows the second portion of the signal to pass through the second path.

The time delay component 114 is fixed and provides the proper delay required for the first portion of the signal to reach transmission line 110 of FIG. 5. The amplitude of the second portion of the signal is typically much lower than the amplitude of the first portion of the signal. Accordingly, the waveform of the first portion of the signal typically approximates the waveform of the incoming RF signal. The time delay component 114 shown in FIG. 5 delays the first portion of the signal to provide a signal with the proper timing so it can be recombined prior to transmission.

The nonlinear attenuator 112 of FIG. 5 modifies the second portion of the signal. The nonlinear attenuator 112 alters the waveform of the second portion of the signal. The transfer linearization circuit 102 combines the first portion and the second portion to form a modified signal that, when amplified by the gain block 120, approximates an ideal signal.

The performance of the nonlinear attenuator is subject to modification. The compensation circuit 16 of FIG. 4 controls the nonlinear attenuator 14 by adjusting the attenuation thereof. The compensation circuit 16 measures the temperature and changes the bias of the nonlinear attenuator 14 accordingly. Potentiometers 146, 148 shown in FIG. 6 can be fine-tuned to optimize the performance of the nonlinear attenuator.

In the present invention little, if any, diode bias trimming is required due to the linearization dependence on channel load, digital loading, and amplifier operating level. As channel load and/or output level increase, the gain stage receives more modification of its incoming signal. The transfer linearization circuit of the present invention creates more signal modification to cancel these distortions. The transfer linearization circuit is optimized for all operating conditions by adjusting the diode bias potentiometer within a narrow voltage range. In the preferred embodiment the voltage is approximately 11.95 $V_{DC}$.

According to the provisions of the patent statutes, we have explained the principle, preferred construction, and mode of operation of our invention and have illustrated and described what we now consider to represent its best embodiments. However, it should be understood that the invention may be practiced otherwise than as specifically illustrated and described.

We claim:

1. A method for modifying an input signal comprising the steps of:

separating a first alternating current component from an input signal to provide a first signal representing the first alternating current component and a second signal representing the input signal having the first alternating current component separated therefrom, attenuating the linear amplitude of the first signal a preselected amount and providing the attenuated first signal with a preselected time delay, modifying the second signal of the input signal with a nonlinear attenuator(NLA) to produce a NLA-modified second signal, combining the attenuated and time delayed first signal with the NLA-modified second signal to produce a corresponding output signal, and incorporating temperature compensation components in the output signal to make the NLA characteristics stable over a preselected temperature range.

2. A method as set forth in claim 1 which includes, applying the output signal to a broadband amplifier to provide enhancement of transfer characteristics.

3. A method as set forth in claim 1 which includes, separating a second alternating current component from the input signal to provide a third order distortion reduction capability modified signal representing the second alternating current component, adjusting attenuating and time delaying a preselected amount the signal level of the modified signal, providing a modified second signal using nonlinear attenuator distortion to enable third order distortion reduction and produce a distorted third signal, combining the signal level and time delay modified first signal with the modified second signal, and providing nonlinear distortion to the signal level adjusted first signal and providing nonlinear distortion to the signal level adjusted third signal to cancel even-ordinal distortion and thereby produce only odd-ordinal nonlinear distortion in the second signal.

4. A method for modifying an input signal comprising the steps of:

separating a first alternating current component from the input signal to provide a first signal representing the first alternating current component and a second signal representing the input signal having the first alternating current component separated therefrom, attenuating the signal level of the first signal, providing nonlinear distortion to the signal level adjusted first signal to produce a distorted first signal, and combining the signal level adjusted second signal with the distorted first signal to produce a corresponding output signal.

5. A method as set forth in claim 4 which includes, separating a second alternating current component from the input signal to provide a third signal representing the input signal with the first and second alternating currents separated therefrom, adjusting the signal level of the third signal, providing nonlinear distortion to the signal level adjusted third signal to produce a distorted third signal, combining the signal level adjusted second signal with the distorted third signal, and wherein the steps of providing nonlinear distortion to the signal level adjusted first signal and providing nonlinear distortion to the signal level adjusted third signal, together operate to cancel even-ordinal distortion and thereby produce only odd-ordinal distortion.

6. A method for supplying a modified RF signal to an amplifier comprising the steps of:

passing a first portion of an unmodified RF signal through a linear attenuator, distorting the first portion of the unmodified RF signal with a time delay component to form a first portion of a modified RF signal, passing a second portion of an unmodified RF signal through a dc blocking device, distorting the second portion of the unmodified RF signal with a nonlinear attenuator to form a second portion of a modified RF signal, and combining the first portion of a modified RF signal with the second portion of a modified RF signal to form a modified RF signal supplying an amplifier.

* * * * *